United States Patent [19]

Carnes

[11] 4,308,473
[45] Dec. 29, 1981

[54] POLYPHASE CODED MIXER

[75] Inventor: Irven S. Carnes, Chelmsford, Mass.

[73] Assignee: Raytheon Company, Lexington, Mass.

[21] Appl. No.: 129,456

[22] Filed: Feb. 21, 1980

Related U.S. Application Data

[62] Division of Ser. No. 909,098, May 24, 1978.

[51] Int. Cl.³ ............... H03B 21/00; H03K 17/16; H03K 17/687
[52] U.S. Cl. ........................... 307/529; 306/243; 307/572; 455/332; 455/333
[58] Field of Search ............... 307/243, 529, 572; 332/43 B; 455/332, 333

[56] References Cited

U.S. PATENT DOCUMENTS

| | | | |
|---|---|---|---|
| 2,942,124 | 6/1960 | Kistler | 307/529 X |
| 3,829,797 | 8/1974 | Karkar et al. | 307/529 X |
| 3,863,136 | 1/1975 | Hanson | 307/529 |
| 4,032,851 | 6/1977 | Hoover | 455/332 |
| 4,090,139 | 5/1978 | Hoover | 455/333 |

*Primary Examiner*—John S. Heyman
*Attorney, Agent, or Firm*—Philip J. McFarland; Joseph D. Pannone

[57] ABSTRACT

A radar fuzing system for a guided missile is shown to include means for impressing a polyphase coded modulation on a transmitted signal and delayed replicas of such modulation on a bank of correlator/mixers, each one of the latter including dual gate field effect transistors as the active elements.

3 Claims, 2 Drawing Figures

POLYPHASE CODED MIXER

CROSS-REFERENCE TO RELATED APPLICATIONS

This is a division of application Serial No. 909,098, filed May 24, 1978.

BACKGROUND OF THE INVENTION

This invention pertains generally to radar fuzing systems and more particularly to an improved mixer/correlator for use in such systems.

As is known in the art, radar fuzing systems, especially those designed for use on board missiles where packaging volume is at a premium, operate at relatively low power levels. Therefore, such systems usually are operated in a continuous wave mode in order to maximize energy on target and are arranged to utilize some kind of binary coding technique (such as that known as polyphase coding) to obtain the requisite target range information. The most common type of polyphase coding is that wherein the phase of the radio frequency (RF) carrier is alternated between 0 and 180 degrees in accordance with an applied binary code. The requisite phase switching is usually accomplished by so-called P-I-N diode phase shifters. Upon reception range information is obtained by correlation processing which is usually performed after the received signals have been downconverted to intermediate frequency (IF) signals or to baseband video signals. Such an approach generally implies a receiver with a relatively high noise figure.

Correlation of any polyphase modulated received signal is achieved by comparing such signal with a delayed replica of the transmitted polyphase code. The time delay corresponds to the desired range to be instrumented at any particular time. The performance of any such system (meaning the accuracy with which range is measured and the degree to which out-of-range clutter returns are rejected) is determined in the first instance by the by the accuracy with which the transmitted RF carrier signal is modulated. Such modulation in turn is determined by the switching speed of the diode phase shifters. Even though high speed P-I-N diodes may be used because of the relatively low power level of the RF carrier signal, the drive circuits for such diodes are usually complex, are power consumptive, and require a substantial packaging volume.

SUMMARY OF THE INVENTION

With this background of the invention in mind it is therefore an object of this invention to provide an improved correlator/mixer capable of performing the combined functions of RF polyphase correlation and downconversion to I.F. or baseband video frequencies.

It is another object of this invention to provide a correlator/mixer having improved bandwidth characteristics for correlating a wideband ranging waveform.

Yet another object of this invention is to provide a correlator/mixer wherein the down/conversion to I.F. or baseband video frequencies is accomplished with a conversion gain.

These and other objects of the invention are attained generally by providing a correlator/mixer including a pair of dual gate field effect transistors (FETs). The source electrodes of each of the FETs are connected together to a constant current source. The polyphase modulated R.F. received signal is applied directly to one of the gate electrodes of a first one of the FETs and, via a 180 degree phase shifter to one of the gate electrodes of the second FET. A local oscillator (LO) signal and a replica of the transmitted code are applied to the second gate electrode of each of the dual gate FETs. Because such coding signals are low frequency signals in comparison with the LO signal, the former appear as gate bias signals to the latter. A summing network is provided to combine the correlated and downconverted output signals appearing at the drain electrodes of each of the FETs.

BRIEF DESCRIPTION OF THE DRAWINGS

The foregoing and other features of the invention, as well as the invention itself, may be more fully understood from the following detailed description read together with the accompanying drawings, in which.

DESCRIPTION OF THE PREFERRED EMBODIMENT

Figure 1:
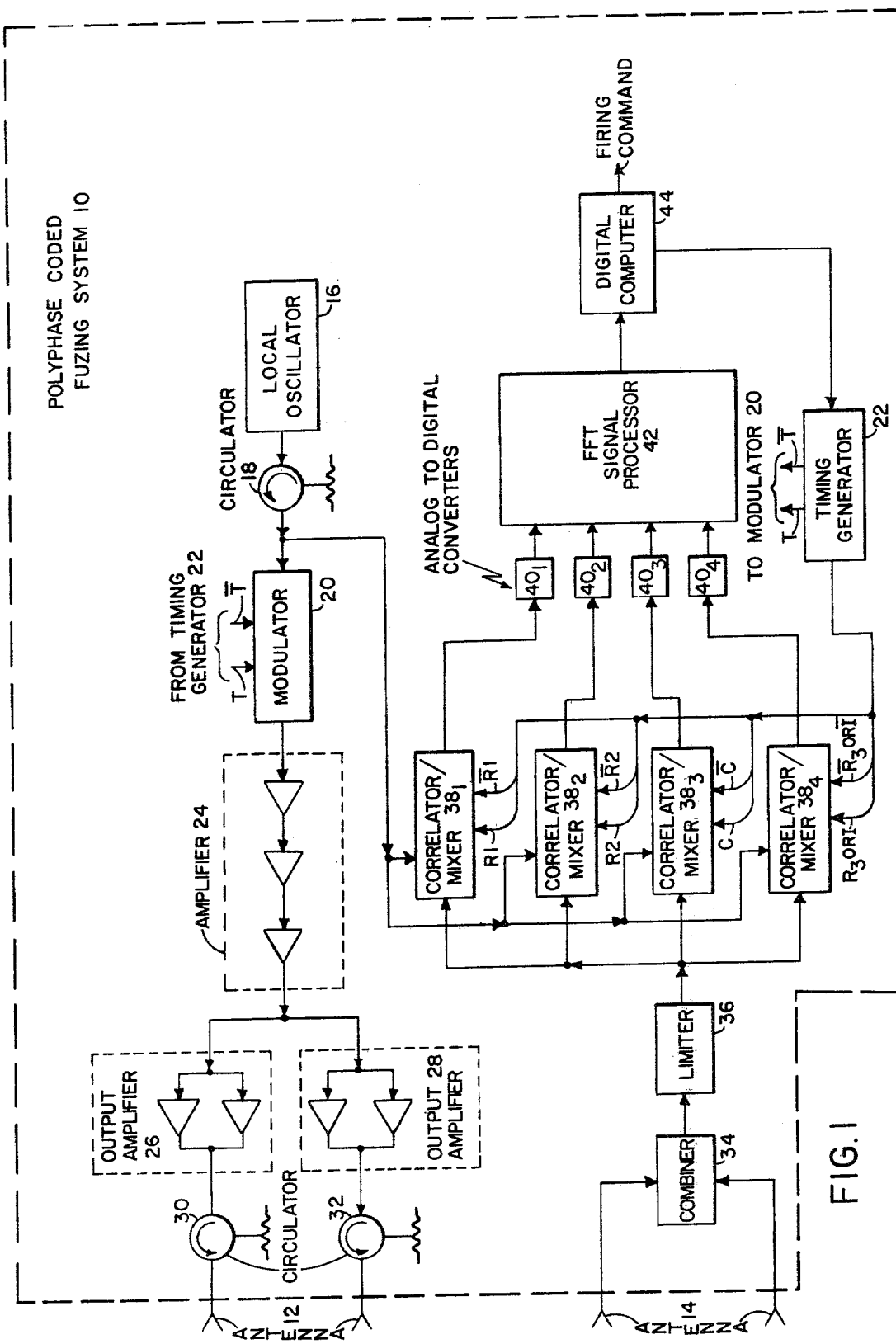
FIG. 1 is a simplified block diagram of a polyphase coded fuzing system according to this invention.

Referring now to FIG. 1, a contemplated polyphase coded fuzing system 10 is shown to include a pair of transmitting antennas 12 and a pair of receiving antennas 14. As is conventional, the transmitting antennas 12 are mounted at diametrically opposite points on the body of a missile (not shown) and the receiving antennas 14 are mounted at points on the body of the missile equally spaced between the transmitting antennas 12. The frequency of the R.F. carrier is controlled by a local oscillator 16, the output signal of which is shown to be applied via a circulator 18, to a modulator 20. The latter is of conventional design and includes a pair of dual gate FETs for providing switching speeds in the range of 70 picoseconds. Such a modulator is described in an article entitled "PSK and QPSK Modulators for Gigabit Data Rates" by C. L. Cuccia and E. W. Matthews, 1977 IEEE MTT-S International Microwave Symposium Digest. Suffice it to say here that in such a device the LO signal is split to provide a pair of input signals separated in phase by 180 degrees. Such phase opposed input signals are applied to the first gate electrodes of separate ones of the dual gate FETs and coding signals (T or $\overline{T}$) from a timing generator 22 are applied to the second gate electrodes. The dual gate FETs are alternately switched "ON" to provide an R.F. signal with the desired polyphase modulation.

The modulated R.F. signal from the modulator 20 is amplified in a three stage FET amplifier chain 24. The output signal from the latter is split and applied as an input signal to a pair of output amplifiers 26, 28. The amplified output signals (which are, of course, the coded transmitted signals) from the latter are passed, via circulators 30, 32, to the transmitting antennas 12.

Radar echo signals reflected from a target (not shown) are intercepted by the receiving antennas 14 and passed to a power combiner 34. The output signals from the latter are limited by a limiter 36 prior to being split and applied to a bank of correlator/mixers $38_1$, $38_2$, $38_3$, $38_4$ (an exemplary one of which is described in detail hereinbelow with reference to FIG. 2) along with delayed replicas of the coded transmitted signals. Suffice it to say here that each one of the correlator/mixers $38_1$, $38_2$, $38_3$, $38_4$ is arranged to detect radar echo signals arriving at a different time after transmission of the coded transmitted signal. With the delays for the correlation/mixers $38_1$, $38_2$, $38_3$, $38_4$ properly set, the radar echo signals from a target will be correlated in at least one of such correlator/mixers. The output signals from the correlator/mixers $38_1$, $38_2$, $38_3$, $38_4$ are digitized by analog-to-digital (A/D) converters $40_1$, $40_2$, $40_3$ and $40_4$ and then are passed to a Fast Fourier Transform (FFT) signal processor 42. The latter, which is of conventional design, performs the functions of Doppler processing and threshold detection of the correlated echo signals. The output signals from the FFT signal processor 42 are passed to a digital computer 44 wherein they are further processed to: (a) control, via the timing generator 22, the time delay of the coded signals on the mixer/correlators $38_1$, $38_2$, $38_3$ and $38_4$; and (b), to provide a firing command to the warhead (not shown) in the missile (not shown).

Figure 2:
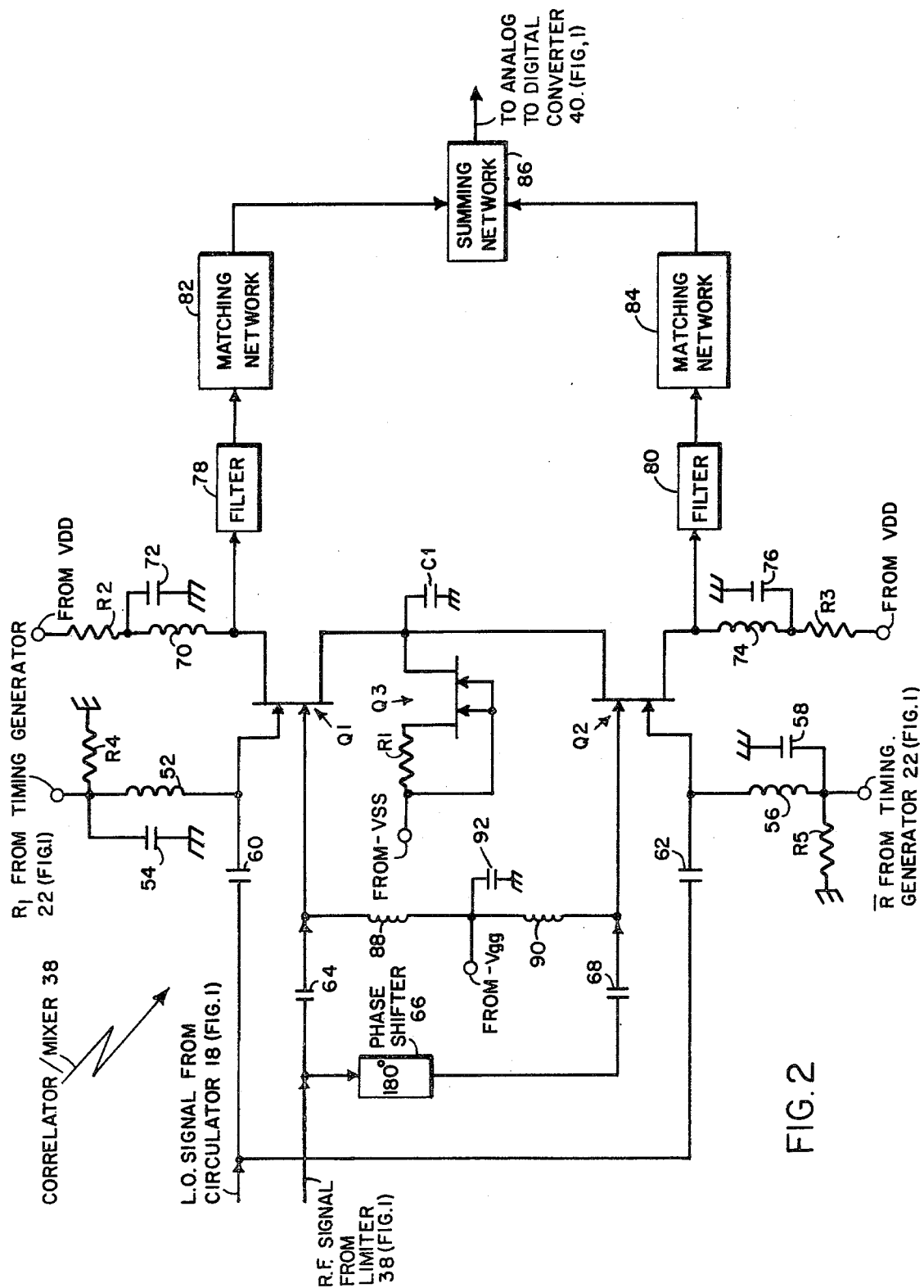
FIG. 2 is a schematic diagram, somewhat simplified, of the correlator/mixer shown generally in FIG. 1.

Referring now to FIG. 2, an exemplary one (mixer/correlator $38_1$) is shown to include a pair of dual gate FETs Q1 and Q2. The source electrodes (not numbered) of the dual gate FETs Q1 and Q2 are connected, via a constant current source (not numbered but comprising resistor R1, capacitor 1 and dual gate FET Q3) to a negative bias supply $-V_{ss}$. Phase coded signal $R_1$ from the timing generator 22 (FIG. 1) is applied via a coil 52 to a first gate electrode of FET Q1. An R.F. bypass capacitor 54 is connected as shown and the LO signal from the circulator 18 (FIG. 1) is connected (through a coupling capacitor 60) to a first gate electrode of FET Q1. A load terminating resistor R4 is connected as shown. With the elements just described, the circulator 18 (FIG. 1) and the timing generator 22 (FIG. 1) are effectively isolated one from the other. Similarly, a gate electrode of FET Q2 is connected as shown to receive the $\overline{R}$ signal from the timing generator 22 (FIG. 1) and the LO signal from the circulator 18 (FIG. 1). The elements in the circuit being discussed which are connected to FET Q2 are, as shown, coil 56, RF bypass capacitor 58, coupling capacitor 62 and resistor R5. The final effect, then, is that the FETs Q1, Q2 are alternately turned "ON" in accordance with the coding signals R1, $\overline{R1}$. That is to say, coding signal R1 causes FET Q1 to be "ON" and coding signal $\overline{R1}$ causes FET Q2 to be "ON".

The RF input signal from limiter 36 (FIG. 1) is shown to be split. A first portion of such RF input signal is applied, via a coupling capacitor 64, to the second gate electrode of FET Q1. A second portion of such RF input signal is shifted by 180 degrees in a phase shifter 66 and then is applied, via a coupling capacitor 68, to the second gate electrode of FET Q2. The coupling capacitors 64, 68 are required to isolate the gate bias voltage, $-V_{gg}$, from the limiter 36 (FIG. 1) Chokes comprising coils 88, 90 and capacitor 92 are provided to prevent the RF signals from limiter 38 (FIG. 1) from entering the gate bias supply $-V_{gg}$. The gate bias voltage $-V_{gg}$ is required to prevent damage to the FETs Q1 and Q2 caused by a possible excess drain current during turn-on and to provide the optimum operating point for gain and noise figure considerations. The drain electrodes (not numbered) of FETs Q1 and Q2 are connected via coils 70, 74 and resistors R2, R3, respectively, to a bias supply VDD. The value of resistors R2, R3 is chosen to control the conversion gain of the correlator/mixer $38_1$. RF bypass capacitors 72, 76 isolate the bias supply VDD.

In operation, when the cding signal R1 causes the FET Q1 to be "ON": (a) the then existing RF signal from the limiter 38 (FIG. 1) is fed directly to an active element, i.e. an element (FET Q1) in which correlation and downconversion may be accomplished; and (b) the then existing RF signal is first shifted in phase by 180° and then fed (without effect) to an inactive element (FET Q2), i.e. an element in which correlation and downconversion cannot be accomplished. Conversely, when the coding signal $\overline{R1}$ causes the FET Q2 to be ON: (a) the then existing RF signal out of the limiter 38 (FIG. 1) to be shifted in phase by 180° and applied to an active element (FET Q2); and (b) the then existing RF signal out of the limiter 38 (FIG. 1) to be fed directly, but without effect, to an inactive element (FET Q1). The effect then is that, at the selected time after the polyphase code is impressed on the signals out of the modulator 20 (FIG. 1), a replica of such code is impressed on the correlator/mixer $38_1$. The nature of the then existing RF signal out of the limiter 36 (FIG. 1) then determines the nature of the outputs of FETs Q1, Q2. If the RF signals are echo signals from a point source at the proper range, i.e. if the FETs Q1, Q2 are ON alternately to coincide with the coded echo signal from a target, then each one of the FETS Q1, Q2 correlates with and mixes a part of the coded echo signals with a corresponding part of the coded LO signals to remove the modulation applied in the modulator 20 (FIG. 1). On the other hand, if the then existing RF signals from the limiter 36 (FIG. 1) are echo signals from extended targets (clutter) or are noise-like signals (no returns) correlation will not be achieved with the coded LO signals so the mixing process results in signals out of the FETs Q1, Q2 which are not coherent CW waveforms and therefore do not integrate coherently in the FFT signal processor 42 to cause a valid detection (FIG. 1). The R1 and $\overline{R1}$ signals are complementary logic signals whose state determines which one of FETs Q1, Q2 is ON. If Q2 is ON a differential phase shift of 180 degrees is applied to the RF carrier signal with respect to that applied if Q1 is ON. Thus, in the correlation mode the operation of correlator/mixer $38_1$ is identical to that of modulator 20 (FIG. 2).

The principles governing the use of a dual gate FET as a mixer having conversion gain has been described in an article entitled "GaAs FETs Gain Ground in Oscillators, Mixers, and Limiters", MICROWAVES, Hayden Publishing Co., Inc., Rochelle Park, New Jersey, June 1977, pp. 9–12. The downconversion mixer described therein employed a single dual gate FET having an LO signal and an RF carrier signal applied to different ones of the two gate electrodes, the source electrode grounded, an IF output signal at the drain electrode and a high pass, low pass filter network and an IF matching network connected to the drain electrode.

In the herein contemplated correlator/mixer $38_1$ using two FETs in a dual gate configuration it has been found to be advantageous to connect the source electrodes of the FETs Q1 and Q2 to the constant current source (not numbered) in order to match the drain currents in each of FETs Q1 and Q2, thereby preventing the induced feedthrough of the R1, $\overline{R1}$ signals into the output circuit because of unequal voltage drops across resistors R2 and R3. Coil 70 and RF bypass capacitor 72 are provided on the drain terminal of FET Q1 to prevent the leakage of the IF output signal from that device to the drain bias supply $V_{DD}$. A similar coil 74 and RF bypass capacitor 76 are provided on the drain terminal of FET Q2.

The output signals from FETs Q1 and Q2 are passed, via filters 78, 80 and matching networks 82, 84, respectively, to a summing network 86 wherein they are combined to provide output signals to be processed further. The filters 78, 80 prevent undesired frequencies produced in the mixing process from being passed to the output circuit (not numbered). The matching networks 82, 84 are provided to match the relatively high output impedance of FETs Q1 and Q2 to the 50 ohm impedance of the summing network 86. It is felt that the design of filters 78, 80 and matching networks 82, 84 are matters involving ordinary skill in the art and will therefore not be recounted here.

It is noted here in passing that FETs Q1, Q2 and Q3 are here Model NEC 463 devices from California Eastern Labs, 1 Edward Ct., Burlingame, Calif. 94010, which have rise and fall times of 70 picoseconds or less and which represent approximately a fifty-to-one improvement in switching speed over P-I-N diodes. The gate electrodes of FETs Q1 and Q2 present no load to the drivers (not shown) other than the small gate parasitic capacitance and, therefore, FETs Q1 and Q2 require a gate voltage change of only 3 to 4 volts to turn ON or OFF as opposed to 15 volts or more for P-I-N diodes. Thus, it can be seen that the use of FETs significantly simplifies the requisite drivers.

Having described a preferred embodiment of a correlator/mixer particularly suited for correlating CW ranging waveforms, it will now be apparent to one of skill in the art that changes may be made without departing from the inventive concepts of this invention. For example, if an IF output signal were desired then a separate local oscillator offset in frequency from that in the transmitter channel could be used with the correlation mixers. If is felt, therefore, that this invention should not be restricted to its disclosed embodiment, but rather should be limited only by the spirit and scope of the appended claims.

What is claimed is:

1. A correlator/mixer comprising:
   (a) first and second dual gate field effect transistors (FETs), each of said FETs having a source terminal, a drain terminal and first and second gate terminals;
   (b) a constant current source, connected to the source terminals of said first and second FETs, comprising a third dual gate FET and a current limiting resistor;
   (c) a RF input circuit connected to a second one of each of the gate terminals of said first and second FETs; and,
   (d) an output circuit connected to the drain terminals of each of said first and second FETs;
   (e) means for connecting a local oscillator signal and a predetermined coded timing signal to each of the first ones of said gate terminals of said first and second dual gate FETs, whereby said first and second dual gate FETs will alternately conduct as a result of said predetermined coded timing signals to thus enable similarly predetermined RF signals of proper strength to correctly correlate and mix with said local oscillator signal.

2. The correlator/mixer as recited in claim 1 wherein said RF input circuit comprises a power divider and a 180 degree phase shifter arranged to provide 180 degree phase opposed RF signals to the second gate terminals of the first and second FETs.

3. The correlator/mixer as recited in claim 2 wherein the output circuit comprises a summing network and a pair of matching networks for matching the output impedance of said first and second FETs to that of the summing network.

* * * * *